United States Patent
Hong

(10) Patent No.: US 8,880,781 B2
(45) Date of Patent: Nov. 4, 2014

(54) MEMORY SYSTEM AND METHOD OF OPERATING A MEMORY SYSTEM

(75) Inventor: Hee-Seok Hong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 380 days.

(21) Appl. No.: 13/273,711

(22) Filed: Oct. 14, 2011

(65) Prior Publication Data

US 2012/0117311 A1    May 10, 2012

(30) Foreign Application Priority Data

Nov. 5, 2010 (KR) .................. 10-2010-0109495

(51) Int. Cl.
   G06F 12/00    (2006.01)
   G06F 1/32     (2006.01)
   G06F 12/02    (2006.01)
   G11C 16/22    (2006.01)

(52) U.S. Cl.
   CPC .... G06F 12/0246 (2013.01); *G06F 2212/7203* (2013.01); G06F 1/3275 (2013.01); *G11C 16/22* (2013.01); *Y02B 60/32* (2013.01); *Y02B 60/1225* (2013.01); *G06F 2212/7207* (2013.01)
   USPC ....... 711/103; 711/102; 713/323; 365/185.33

(58) Field of Classification Search
   CPC ............. G06F 12/0246; G06F 3/0679; G06F 2212/2022; G06F 2212/7211; G06F 2212/7203; G06F 2212/7207
   USPC ............... 711/102, 103; 713/323; 365/185.33
   See application file for complete search history.

(56) References Cited

U.S. PATENT DOCUMENTS

| 7,237,127 B2 | 6/2007 | Chao et al. | |
|---|---|---|---|
| 2004/0123057 A1 | 6/2004 | Freudenschuss et al. | |
| 2005/0055591 A1* | 3/2005 | Cho ............................. | 713/320 |
| 2006/0139982 A1* | 6/2006 | de Sandre ....................... | 365/49 |
| 2008/0034242 A1* | 2/2008 | Ishikura et al. ............... | 713/323 |
| 2009/0217026 A1 | 8/2009 | Chuang et al. | |
| 2009/0276560 A1* | 11/2009 | Wakrat et al. ................. | 711/101 |
| 2012/0110249 A1* | 5/2012 | Jeong et al. ................... | 711/103 |

FOREIGN PATENT DOCUMENTS

KR    100505638 A    3/2004

* cited by examiner

*Primary Examiner* — Reginald Bragdon
*Assistant Examiner* — Mehdi Namazi
(74) *Attorney, Agent, or Firm* — Harness, Dickey & Pierce, P.L.C.

(57) ABSTRACT

A memory system according to at least one example embodiment stores meta data in a cache register when the memory system enters a standby mode. Therefore, the memory system may reduce power consumption in the standby mode, and/or rapidly perform a mode switch.

18 Claims, 15 Drawing Sheets

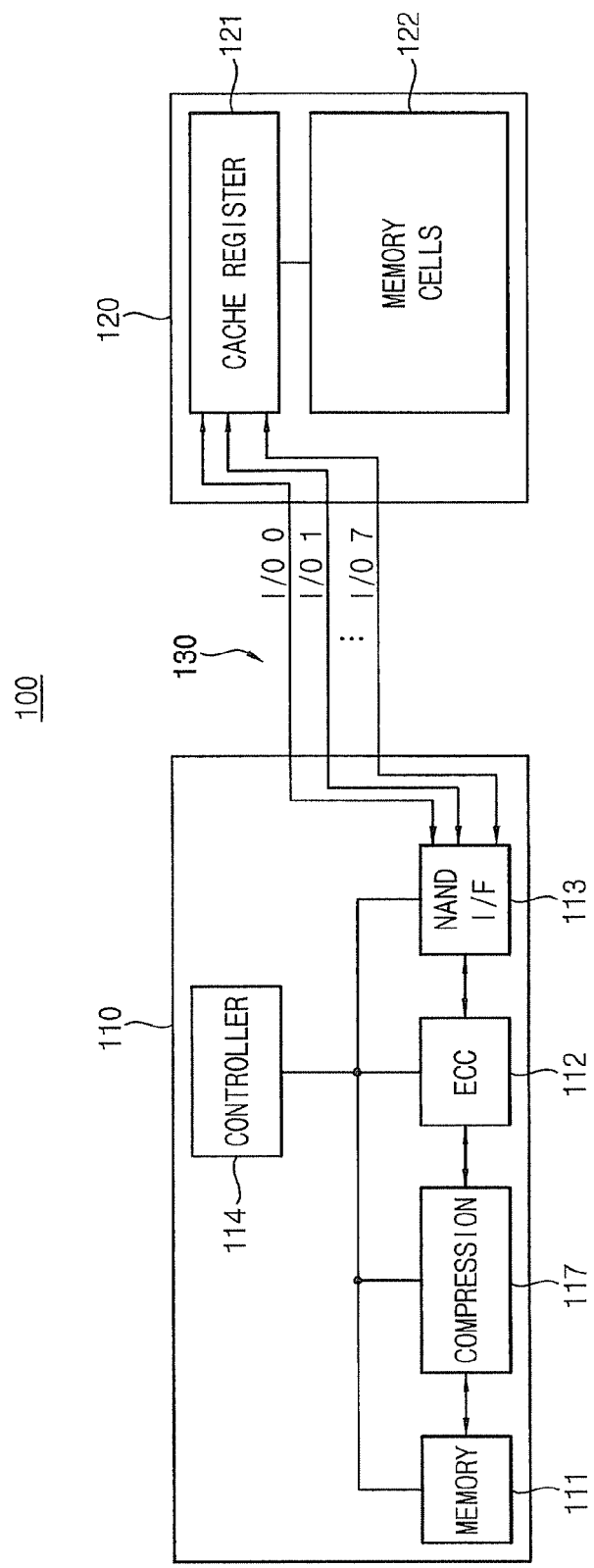

MEMORY SYSTEM AND METHOD OF OPERATING A MEMORY SYSTEM

CROSS-REFERENCE TO RELATED APPLICATIONS

This U.S. non-provisional application claims the benefit of priority under 35 U.S.C. §119 to Korean Patent Application No. 2010-0109495 filed on Nov. 5, 2010 in the Korean Intellectual Property Office (KIPO), the entire contents of which are incorporated herein by reference.

BACKGROUND

1. Technical Field

Example embodiments relate to memory systems and methods of operating memory systems. More particularly, example embodiments relate to memory systems and methods of operating memory systems capable of reducing power consumption.

2. Description of the Related Art

A memory system used for a portable device, such as a mobile phone, may support a standby mode to reduce power consumption. For example, a memory system may shut off power to at least a portion of circuitry in the standby mode, thereby reducing power consumption. However, to extend battery life of the portable device, it is desirable to further reduce the power consumption.

SUMMARY

Some example embodiments provide a memory system capable of reducing power consumption in a standby mode and/or rapidly performing a mode switch between a normal mode and the standby mode.

Some example embodiments provide a method of operating a memory system capable of reducing power consumption in a standby mode and/or rapidly performing a mode switch between a normal mode and the standby mode.

According to at least one example embodiment, a memory system includes a NAND flash memory and a control unit. The NAND flash memory includes a cache register and memory cells. The NAND flash memory stores data in the memory cells via the cache register. The control unit includes a working memory. The control unit controls the NAND flash memory, and stores meta data in the working memory. The control unit is configured to control that cache register to store the meta data if the memory system enters a standby mode.

In some embodiments, the control unit may be configured such that the control unit controls the NAND flash memory to not store the meta data to the memory cells if the memory system enters the standby mode.

In some embodiments, the NAND flash memory may be configured to read the meta data from the working memory and write the meta data to the cache register in response to a write command generated by the control unit when the memory system enters the standby mode.

In some embodiments, the control unit may be configured to generate the write command such that an address field included in a code of the write command has a NULL state.

In some embodiments, the control unit may be configured to generate the write command such that a code of the write command does not include an address field.

In some embodiments, the control unit may be configured to generate the write command such that a code of the write command indicates that the meta data read from the working memory is to be written only to the cache memory, and is different from a code of a normal write command that indicates normal data are to be written to the memory cells via the cache memory.

In some embodiments, the NAND flash memory may be configured to read the meta data from the cache register and to write the meta data to the working memory in response to a read command generated by the control unit when the memory system is woken up from the standby mode.

In some embodiments, the memory cells may be arranged in a matrix form of a plurality of columns and a plurality of rows, and the cache register may correspond to one of the plurality of columns or one of the plurality of rows.

In some embodiments, the memory system may be configured such that memory cells are not supplied with power during the standby mode. According to at least one example embodiment, in a method of operating a memory system including a control unit and a NAND flash memory, the NAND flash memory including a cache register and memory cells and a control unit including a working memory, the NAND flash memory configured to store data in the memory cells via the cache register, the control unit configured to control the NAND flash memory and to store meta data in the working memory, may include reading the meta data from the working memory using the NAND flash memory if the memory system enters a standby mode; generating a write command using the control unit; generating a write command code by inserting the read meta data into a code of the write command using the control unit; and writing the meta data to the cache register in response to the write command code using the NAND flash memory.

In some embodiments, the meta data may not be written to the memory cells when the memory system enters the standby mode.

In some embodiments, an address filed included in the write command code may have a NULL state.

In some embodiments, the write command code may not include an address field.

In some embodiments, the write command code may indicate that the meta data read from the working memory is to be written only to the cache memory, and the write command code may be different from a code of a normal write command that indicates normal data are to be written to the memory cells via the cache memory.

In some embodiments, the memory cells may be arranged in a matrix form of a plurality of columns and a plurality of rows, and the cache register may correspond to one of the plurality of columns or one of the plurality of rows.

In some embodiments, the memory system may enter the standby mode after the meta data is written to the cache register, and a wake-up command may be generated after the memory system enters the standby mode.

In some embodiments, the method may further comprise generating a read command for reading the meta data from the cache register in response to the wake-up command using the control unit.

In some embodiments, the meta data read from the cache register may be written to the working memory.

According to at least one example embodiment, a control unit includes a controller, a working memory and a nonvolatile memory interface. The controller is powered off when the controller enters a standby mode. The working memory stores meta data of the controller. The nonvolatile memory interface interfaces between the controller and a nonvolatile memory. The controller may be configured such that, when the controller enters the standby mode, the controller generates a command code for storing the meta data in a cache register of the nonvolatile memory and not in memory cells of the nonvolatile memory, and the controller provides the command code to the nonvolatile memory.

In some embodiments, the working memory and the controller may be implemented in separate chips or in a single chip.

According to at least one example embodiment, a memory system may include a control unit control unit including a working memory configured to store meta data, the control unit being configured to control a flash memory unit including a plurality of memory cells and a cache register such that if the memory system is in a standby mode, the control unit generates a standby write command indicating the flash memory device to store the meta data in the cache register and not in the plurality of memory cells.

The memory system may, further comprise the flash memory unit, wherein the cache register is configured to store data to be written to the plurality of memory cells, and the memory system is configured such that if the memory system enters the standby mode, the memory system supplies power to the cache register, and the memory system reduces power being supplied to the working memory.

The memory system may be configured such that if the memory system enters the standby mode, the memory system does not supply power to the working memory. The memory system may be configured such that if the memory system enters the standby mode, the memory system does not supply power to the plurality of memory cells.

According to at least one example embodiment, a memory system may include a flash memory unit including a plurality of memory cells and a cache register configured to store data to be written to the plurality of memory cells, the flash memory unit being configured to be controlled by a control unit including a working memory storing meta data such that, if the memory system is in a standby mode, the flash memory stores the meta data in the cache register and not in the plurality of memory cells in response to a write command received from the control unit.

The memory system of claim may further comprise the control unit, wherein the cache register is configured to store data to be written to the plurality of memory cells, and the memory system is configured such that if the memory system enters the standby mode, the memory system supplies power to the cache register, and the memory system reduces power being supplied to the working memory.

The memory system may be configured such that if the memory system enters the standby mode, the memory system does not supply power to the working memory. The memory system may be configured such that if the memory system enters the standby mode, the memory system does not supply power to the plurality of memory cells.

As described above, a memory system and a method of operating the memory system according to at least one example embodiment can rapidly perform a mode switch between a normal mode and a standby mode, and can reduce power consumption in the standby mode.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 1 is a block diagram illustrating a memory system according to at least one example embodiment.

DETAILED DESCRIPTION OF THE EMBODIMENTS

Figure 2A:
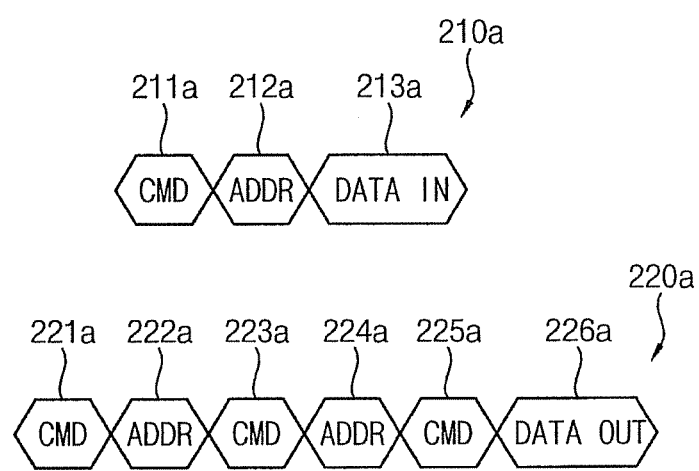
FIGS. 2A through 2C are diagrams illustrating examples of a write command code and a read command code.

Detailed example embodiments are disclosed herein. However, specific structural and functional details disclosed herein are merely representative for purposes of describing example embodiments. Example embodiments may, however, be embodied in many alternate aims and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the teen "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system according to at least one example embodiment.

Referring to FIG. 1, a memory system 100 includes a control unit 110, a NAND flash memory 120 and a channel 130.

The control unit 110 may control operations of the memory system 100 and/or the NAND flash memory 120. For example, the control unit 110 may control a program operation, a read operation and an erase operation of the NAND flash memory 120. The control unit 110 may include a working memory 111, a compression unit 117, an error correction code (ECC) unit 112, a NAND interface unit 113 and a controller 114.

The working memory 111 may store meta data for operating the memory system 100 and/or the control unit 110. The working memory 111 may be a volatile memory that loses stored data when power is interrupted. For example, the working memory 111 may be implemented by a static random access memory (SRAM), a dynamic random access memory (DRAM), etc.

The meta data may be used by the control unit 110 during a normal mode, and may not be used during the standby mode. The meta data may be generated and/or processed while the control unit 110 operates. For example, the meta data may include a value of a special function register of the control unit 110, a variable declared when the control unit 110 operates, information about the capacity of the NAND flash memory 120, information about the number of units in the NAND flash memory 120 (e.g., a number of memory cells), information about the channel 130, information about an address of user data, information about a creation time of the user data, information about a standard of the user data, etc.

The compression unit 117 may compress data provided from the working memory 111 or another memory (not shown), and may provide the compressed data to the NAND flash memory 120 via the NAND interface unit 113 and the channel 130. The compression unit 117 may receive compressed data from the NAND flash memory 120, and may recover original data from the compressed data. For example, when the memory system 100 enters the standby mode, the meta data stored in the working memory 111 may be compressed by the compression unit 117, and then may be stored in a cache register 121 of the NAND flash memory 120. When the memory system 100 is woken up from the standby mode, the compressed meta data stored in the cache register 121 may be decompressed by the compression unit 117, and then may be stored again in the working memory 111. The compression unit 117 may perform various types of compression operations and/or decompression operations. In some embodiments, the compression operation and the decompression operation may be performed by the controller 114, and the control unit 110 may be implemented without a separate compression unit.

The ECC unit 112 may generate an error correction code based on data provided from the working memory 111 or another memory (not shown), and may provide the error correction code to the NAND flash memory 120 via the NAND interface unit 113 and the channel 130. The ECC unit 112 may receive an error correction code from the NAND flash memory 120, and may recover data based on the error correction code. Accordingly, original data may be exactly recovered even if an error occurs during data transfer or data storage. The control unit 110 may be implemented with or without the ECC unit 112.

When the memory system 100 enters the standby mode, the compression unit 117 may compress the meta data received from the working memory 111, and the ECC unit 112 may generate an error correction code based on the compressed meta data. The error correction code may be transferred and stored in the cache register 121 of the NAND flash memory 120 via the NAND interface unit 113 and the channel 130. When the memory system 100 is woken up from the standby mode, the ECC unit 112 may receive the error correction code from the cache register 121 via the channel 130 and the NAND interface unit 113, and may recover the compressed meta data based on the received error correction code. The compression unit 117 may receive the compressed meta data from the ECC unit 112, and may decompress the compressed meta data to provide the meta data to the working memory 111. Although FIG. 1 illustrates an example where the compression unit 117 is located between the working memory 111 and the ECC unit 117, in some embodiments, the compression unit 117 may be located between the ECC unit 112 and the NAND interface unit 113. In this case, an error correction code may be generated by the ECC unit 112 based on the meta data stored in the working memory 111, and the error correction code may be compressed by the compression unit 117 to provide the compressed error correction code to the cache register 121 of the NAND flash memory 120.

The NAND interface unit 113 may provide an interface between the control unit 110 and the NAND flash memory 120. For example, the NAND interface unit 113 may be controlled by the controller 114 to write data provided from the working memory 111 or another memory (not shown) to the NAND flash memory 120 or to read stored data from the NAND flash memory 120.

The controller 114 may control operations of the control unit 110. For example, the controller 114 may control the control unit 110 to perform a write operation that writes data to the NAND flash memory 120 or a read operation that reads data from the NAND flash memory 120. Further, the controller 114 may perform a standby mode entry operation from the normal mode to the standby mode or a wake-up operation from the standby mode to the normal mode.

The NAND flash memory 120 may store data provided from the control unit 110 via the channel 130. The NAND flash memory 120 may include the cache register 121 and memory cells 122. During the write operation, the data provided from the control unit 110 may be temporarily stored in the cache register 121, and the data stored in the cache register 121 may be programmed into the memory cells 122 on a page basis. During the read operation, data stored in the memory cells 122 may be temporarily stored in the cache register 121 on a page basis, and the data stored in the cache register 121 may be output to the control unit 110. For example, the cache register 121 may be implemented by a plurality of flip-flops or a plurality of latches. The memory cells 122 may be arranged in a matrix form including a plurality of columns and a plurality of rows. The NAND flash memory 120 may include various sizes or numbers of the cache register 121 according to at least one example embodiment. For example, the NAND flash memory 120 may include two cache registers, each of which has a size corresponding to one page of the memory cells 122.

The channel 130 may provide paths for a command, an address, data, etc. between the control unit 110 and the NAND flash memory 120. The channel 130 may include a plurality of input/output lines I/O 0, I/O 1 and I/O 7. For example, the command, the address and input data may be transferred from the control unit 110 to the NAND flash memory 120 via the input/output lines I/O 0, I/O 1 and I/O 7 having an 8 bit width, and output data may be transferred from the NAND flash memory 120 to the control unit 110 via the input/output lines I/O 0, I/O 1 and I/O 7 having the 8 bit width.

Although it is not illustrated in FIG. 1, the channel 130 may further include a control line for transferring a control signal. For example, the control line may transfer a command latch enable (CLE) signal, an address latch enable (ALE) signal, a chip enable (/CE) signal, a read enable (/RE) signal, a write enable (/WE) signal, a write protect (/WP) signal, a ready/busy output (R/B) signal, a power supply (VCC) signal, a ground (VSS) signal, etc. Although FIG. 1 illustrates the channel 130 including eight input/output lines I/O 0, I/O 1 and I/O 7, in some embodiments, the channel 130 may include one or more input/output lines.

Hereinafter, a mode switch of the memory system 100 from the normal mode to the standby mode or from the standby mode to the normal mode will be described below.

When the memory system 100 enters the standby mode, the controller 114 may control the working memory 111 to provide the meta data to the NAND interface unit 113. In some embodiments, the ECC unit 112 may generate an error correction code from the meta data read from the working memory 111, and the error correction code may be provided to the NAND interface unit 113. The meta data may be compressed by the compression unit 117, and the compressed meta data may be provided to the NAND interface unit 113. The NAND interface unit 113 may be controlled by the controller 114 to generate a write command code including the meta data. The write command code may be provided to the NAND flash memory 120 via the channel 130. The NAND flash memory 120 may receive the write command code through the channel 130, and may store the meta data in the cache register 121 in response to the write command code. The write command code may inform the NAND flash memory 120 that the meta data are to be stored in the cache register 121 and are not to be programmed into the memory cells 122. Thus, in response to the write command code, the NAND flash memory 120 may store the meta data in the cache register 121, and may not program the meta data into the memory cells 122. The write command code will be described in detail below with reference to FIGS. 2A through 2C.

Since the meta data are stored in the cache register 121 of the NAND flash memory 120 in the standby mode, the memory system 100 may not supply power to the working memory 111 in the standby mode. Accordingly, power consumption may be reduced during the standby mode.

In some embodiments, power supply for the cache register 121 and power supply for the memory cells 122 may be independently controlled. In this case, during the standby mode, the cache register 121 may be continuously supplied with power, and the memory cells 122 may not be supplied with power. Accordingly, power consumption may be further reduced during the standby mode.

When the memory device 100 is woken up from the standby mode, the NAND interface unit 113 may be controlled by the controller 114 to generate a read command code. The NAND flash memory 120 may receive the read command code through the channel 130, and may output the meta data stored in the cache register 121. The control unit 110 may receive the meta data through the channel 130, and may store the meta data in the working memory 111. The control unit 110 may perform operations of the normal mode (e.g., a program operation, a read operation or an erase operation) based on the meta data stored in the working memory 111.

Accordingly, since the meta data may be written to the cache register 121 instead of the memory cells 122 when the memory device 100 enters the standby mode, and the meta data may be read from the cache register 121 instead of the memory cells 122 when the memory device 100 is woken up from the standby mode, a mode switch between the natural mode and the standby mode may be rapidly performed.

As described above, in the memory system 100 according to at least one example embodiment, since the meta data of the working memory 111 may be stored in the cache register 121 of the NAND flash memory 120, the working memory 111 may not be supplied with power, thereby reducing power consumption in the standby mode. Further, in the memory system 100 according to at least one example embodiment, since the meta data may be written to or read from the cache register 121 instead of the memory cells 122, the standby mode entry operation and the wake-up operation may be rapidly performed.

The working memory 111 and the controller 114 may be implemented in the same chip, or may be implemented in separate chips. Although FIG. 1 illustrates the memory system 100 including the NAND flash memory 120, in some embodiments, the memory system 100 may include, instead of or along with the NAND flash memory 120, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), a NOR flash memory, etc. Although FIG. 1 illustrates the memory system 100 including one NAND flash memory 120, the memory system 100 may include a plurality of NAND flash memories. In a case where the memory system 100 may include a plurality of NAND flash memories, the memory system 100 may include one or more channels between the control unit 110 and the plurality of NAND flash memories.

Figure 2B:
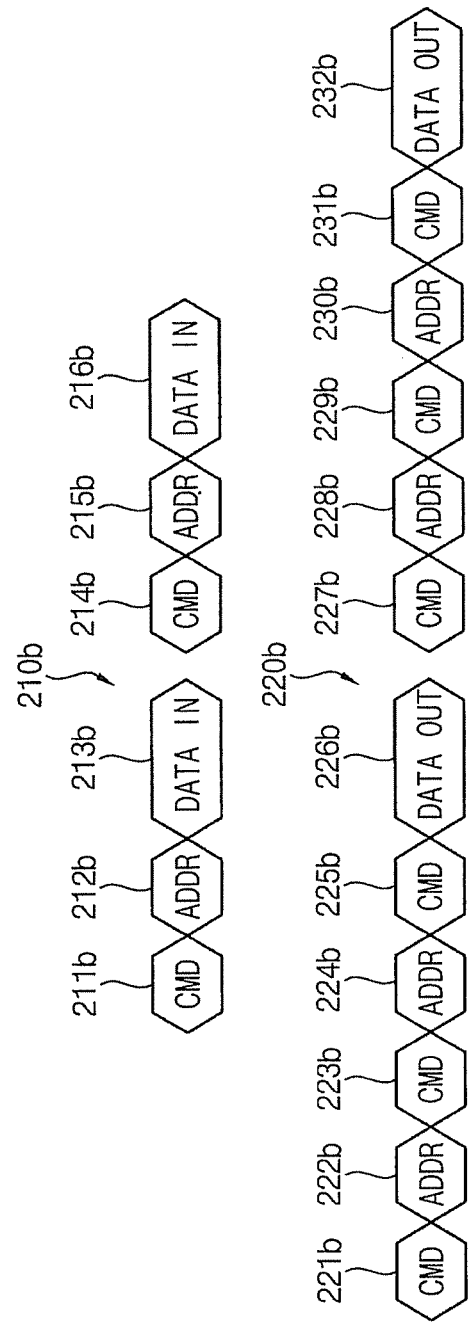
Figure 2C:
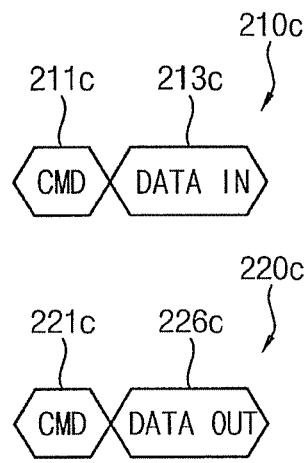

FIGS. 2A through 2C are diagrams illustrating examples of a write command code and a read command code.

FIG. 2A illustrates an example of a write command code and a read command code using a typical NAND interface protocol.

Referring to FIG. 2A, a write command code 210a includes a first command field 211a, a first address field 212a and an input data field 213a. The first command field 211a may be filled with a serial data input command (e.g., 80h). In some embodiments, the first address field 212a may have a NULL state, or may be filled with 'NULL'. For example, all bits of the first address field 212a may be fixed to logic low states or high impedance (Hi-Z) states. In other embodiments, the first address field 212a may be filled with a specific pattern of bits indicating that data are to be stored in a cache register. In still other embodiments, data in the first address field 212a may be ignored. The input data field 213a may be filled with meta data stored in a working memory 111 illustrated in FIG. 1. For example, the input data field 213a may be filled with the meta data up to a size of one page (e.g., 8K bytes).

When a memory system 100 of FIG. 1 enters a standby mode, a control unit 110 of FIG. 1 may transfer the write command code 210a to a NAND flash memory 120 of FIG. 1, and may not transfer a page program confirm command (e.g., 10h) after the write command code 210a is transferred. Since the NAND flash memory 120 of FIG. 1 receives the write command code 210a without receiving the page program confirm command, the NAND flash memory 120 of FIG. 1 may store the meta data of the input data field 213a in a cache register 121 of FIG. 1 without programming the meta data into memory cells 122 of FIG. 1.

A read command code 220a may include a second command field 221a, a second address field 222a, a third command field 223a, a third address field 224a, a fourth command field 225a and an output data field 226a. For example, the second command field 221a may be filled with "00h", the second address field 222a may be filled with 'NULL' or a specific pattern, the third command field 223a may be filled with "05h", the third address field 224a may be filled with 'NULL' or a specific pattern, and the fourth command field 225a may be filled with "E0h". The output data field 226a may be filled with meta data stored in the cache register 121 of FIG. 1. For example, the output data field 226a may be filled with the meta data up to a size of one page (e.g., 8K bytes).

When the memory system 100 of FIG. 1 is woken up from the standby mode, the control unit 110 of FIG. 1 may not transfer a read confirm command (e.g., 30h) to the NAND flash memory 120 of FIG. 1, and may transfer the second command field 221a, the second address filed 222a, the third command filed 223a, the third address filed 224a and the fourth command filed 225a that are filled with values described above. Then, the NAND flash memory 120 of FIG. 1 may not read a page from the memory cells 122 of FIG. 1 to the cache register 121 of FIG. 1, and may fill the output data field 226a with the meta data stored in the cache register 121 of FIG. 1 to provide the meta data to the control unit 110 of FIG. 1.

FIG. 2B illustrates an example of a two-plane write command code of and a two-plane read command code using a typical NAND interface protocol. A NAND flash memory using the write command code and the read command code illustrated in FIG. 2B may support a two-plane program operation and a two-plane read operation.

Referring to FIG. 2B, a write command code 210b includes a first command field 211b, a first address field 212b, a first input data field 213b, a second command filed 214b, a second address field 215b and a second input data field 216b. For example, the first command 211b may be filled with "80h", the first address field 212b may be filled with 'NULL' or a specific pattern, the second command filed 214b may be filled with "81h", the second address field 215b may be filled with 'NULL' or a specific pattern. The first input data field 213b and the second input data field 216b may be filled with meta data stored in a working memory 111 of FIG. 1. For example, each of the first input data field 213b and the second input data field 216b may be filled with the meta data up to a size of one page.

When a memory system 100 of FIG. 1 enters a standby mode, a control unit 110 of FIG. 1 may transfer the write command code 210b to a NAND flash memory 120 of FIG. 1, and may transfer neither a dummy page program command (e.g., 11h) nor a page program command (e.g., 10h). Since the NAND flash memory 120 of FIG. 1 receives the write command code 210b without receiving the dummy page program command and the page program command, the NAND flash memory 120 of FIG. 1 may store the meta data of the first input data field 213b and the second input data field 216b in a cache register 121 of FIG. 1 without programming the meta data into memory cells 122 of FIG. 1.

A read command code 220b may include a third command field 221b, a third address field 222b, a fourth command field 223b, a fourth address field 224b, a fifth command field 225b, a first output data field 226b, a sixth command field 227b, a fifth address field 228b, a seventh command filed 229b, a sixth address field 230b, an eighth command field 231b and a second output data field 232b. For example, the third command field 221b may be filled with "00h", the third address field 222b may be filled with 'NULL' or a specific pattern, the fourth command field 223b may be filled with "05h", the fourth address field 224b may be filled with 'NULL' or a specific pattern, the fifth command field 225b may be filled with "E0h", the sixth command field 227b may be filled with "00h", the fifth address field 228b may be filled with 'NULL' or a specific pattern, the seventh command filed 229b may be filled with "05h", the sixth address field 230b may be filled with 'NULL' or a specific pattern, and the eighth command field 231b may be filled with "E0h". The first output data field 226b and the second output data field 232b may be filled with meta data stored in the cache register 121 of FIG. 1. For example, in a case where the NAND flash memory 120 of FIG. 1 may include two cache registers, each of which each of which has a size corresponding to one page of the memory cells 122 of FIG. 1, The first output data field 226b and the second output data field 232b may be filled with the meta data stored in the two cache registers, respectively.

When the memory system 100 of FIG. 1 is woken up from the standby mode, the control unit 110 of FIG. 1 may not transfer a read confirm command (e.g., 30h) to the NAND flash memory 120 of FIG. 1, and may transfer the third command field 221*b*, the third address field 222*b*, the fourth command field 223*b*, the fourth address field 224*b* and the fifth command field 225*b* that are filled with values described above. Then, the NAND flash memory 120 of FIG. 1 may not read a page from the memory cells 122 of FIG. 1 to one cache register, and may fill the first output data field 226*b* with the meta data stored in the one cache register to provide the meta data to the control unit 110 of FIG. 1. Thereafter, the control unit 110 of FIG. 1 may transfer the sixth command field 227*b*, the fifth address field 228*b*, the seventh command filed 229*b*, the sixth address field 230*b* and the eighth command field 231*b* that are filled with values described above. Then, the NAND flash memory 120 of FIG. 1 may not read a page from the memory cells 122 of FIG. 1 to another cache register, and may fill the second output data field 232*b* with the meta data stored in the another cache register to provide the meta data to the control unit 110 of FIG. 1.

FIG. 2C illustrates an example of a write command code and a read command code that are added to a command set of a typical NAND interface protocol.

Referring to FIG. 2C, a write command code 210*c* includes a first command field 211*c* and an input data field 213*c*. The first command field 211*c* may be filled with a new command value that is not defined in the command set of the typical NAND interface protocol. For example, the new command value may be a value of one byte, exclusive of "00h", "05h, "10h", "11h", "30h", "35h", "60h", "70h", "7Bh", "80h", "81h", "81h", "90h", "D0h", "E0h", "F1h", "FFh", etc. The input data field 213*c* may be filled with meta data stored in a working memory 111 illustrated in FIG. 1. For example, the input data field 213*c* may be filled with the meta data up to a size of one page or more.

When a memory system 100 of FIG. 1 enters a standby mode, a control unit 110 of FIG. 1 may transfer the write command code 210*c* to a NAND flash memory 120 of FIG. 1. Then, the NAND flash memory 120 of FIG. 1 may store the meta data of the input data field 213*c* in a cache register 121 of FIG. 1 without programming the meta data into memory cells 122 of FIG. 1.

A read command code 220*c* may include a second command field 221*c* and an output data field 226*c*. The second command field 211*c* may be filled with a new command value that is not defined in the command set of the typical NAND interface protocol. For example, the new command value may be a value of one byte, exclusive of "00h", "05h, "10h", "11h", "30h", "35h", "60h", "70h", "7Bh", "80h", "81h", "85h", "90h", "D0h", "E0h", "F1h", "FFh", etc. The output data field 226*c* may be filled with meta data stored in the cache register 121 of FIG. 1. For example, the output data field 226*c* may be filled with the meta data up to a size of one page or more.

When the memory system 100 of FIG. 1 is woken up from the standby mode, the control unit 110 of FIG. 1 may transfer the second command field 221*c* that is filled with values described above. Then, the NAND flash memory 120 of FIG. 1 may not read a page from the memory cells 122 of FIG. 1 to the cache register 121 of FIG. 1, and may fill the output data field 226*c* with the meta data stored in the cache register 121 of FIG. 1 to provide the meta data to the control unit 110 of FIG. 1.

Figure 3:
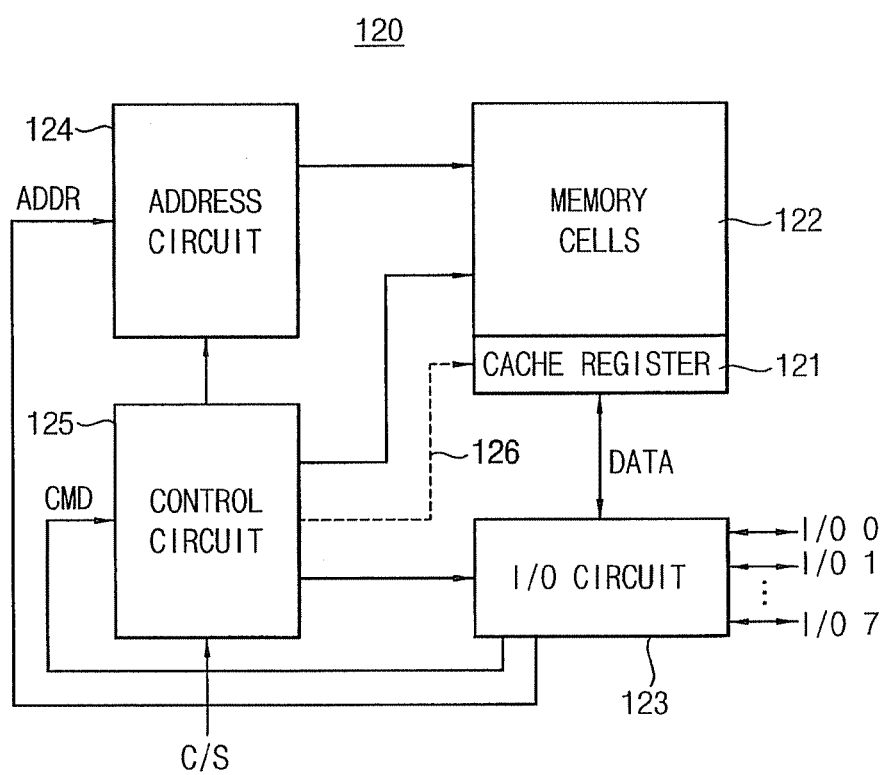
FIG. 3 is a block diagram illustrating a NAND flash memory included in a memory system of FIG. 1.

FIG. 3 is a block diagram illustrating a NAND flash memory included in a memory system of FIG. 1.

Referring to FIG. 3, a NAND flash memory 120 includes a cache register 121, memory cells 122, an input/output circuit 123, an address circuit 124 and a control circuit 125.

The input/output circuit 123 may be coupled to a channel 130 of FIG. 1 including a plurality of input/output lines I/O 0, I/O 1 and I/O 7. The input/output circuit 123 may receive a command CMD, an address ADDR and input data DATA from a control unit 110 of FIG. 1 through the plurality of input/output lines I/O 0, I/O 1 and I/O 7, and may transmit output data DATA to the control unit 110 of FIG. 1 through the plurality of input/output lines I/O 0, I/O 1 and I/O 7. The input/output circuit 123 may provide the control circuit 125 with the command CMD received from the control unit 110 of FIG. 1, may provide the address circuit 124 with the address ADDR received from the control unit 110 of FIG. 1, may provide the cache register 121 with the input data DATA received from the control unit 110 of FIG. 1, and may provide the control unit 110 of FIG. 1 with the output data DATA received from the cache register 121.

The address circuit 124 may latch and decode the address ADDR received from the control unit 110 of FIG. 1 via the input/output circuit 123 to select a row of the memory cells 122 and/or a column of the cache register 121.

The control circuit 125 may control operations of the NAND flash memory 120 in response to the command CMD received from the control unit 110 of FIG. 1 via the input/output circuit 123. The control circuit 125 may generate a wordline voltage, such as a program voltage, a pass voltage, a verify voltage, a read voltage, etc. The control circuit 125 may receive a control signal C/S from the control unit 110 of FIG. 1. For example, the control circuit 125 may receive a CLE signal, an ALE signal, a /CE signal, a /RE signal, a /WE signal, a /WP signal, a R/B signal, etc.

In some embodiments, the control circuit 125 may supply power to the cache register 121 through a power supply path 126 that is exclusively used for the cache register 121. For example, the control circuit 125 may supply power to the cache register 121 through the power supply path 126 in a standby mode, and may shut off power to at least a portion of circuitry except the cache register 121 of the NAND flash memory 120 in the standby mode. In particular, the memory cells 122 may not be supplied with power during the standby mode.

The input data DATA received from the control unit 110 of FIG. 1 via the input/output circuit 123 may be loaded into the cache register 121, and the input data DATA loaded into the cache register 121 may be programmed into the memory cells 122 on a page basis. The output data DATA may be read from the memory cells 122 to the cache register 121 on a page basis, and may be provided from the cache register 121 to the control unit 110 of FIG. 1 via the input/output circuit 123.

When entering the standby mode, meta data DATA received from the control unit 110 of FIG. 1 via the input/output circuit 123 may be stored in the cache register 121, and may not be programmed into the memory cells 122. When waking up from the standby mode, a data read operation from the memory cells 122 to the cache register 122 may not be performed, and the meta data DATA stored in the cache register 121 may be provided to the control unit 110 of FIG. 1 via the input/output circuit 123.

Figure 4:
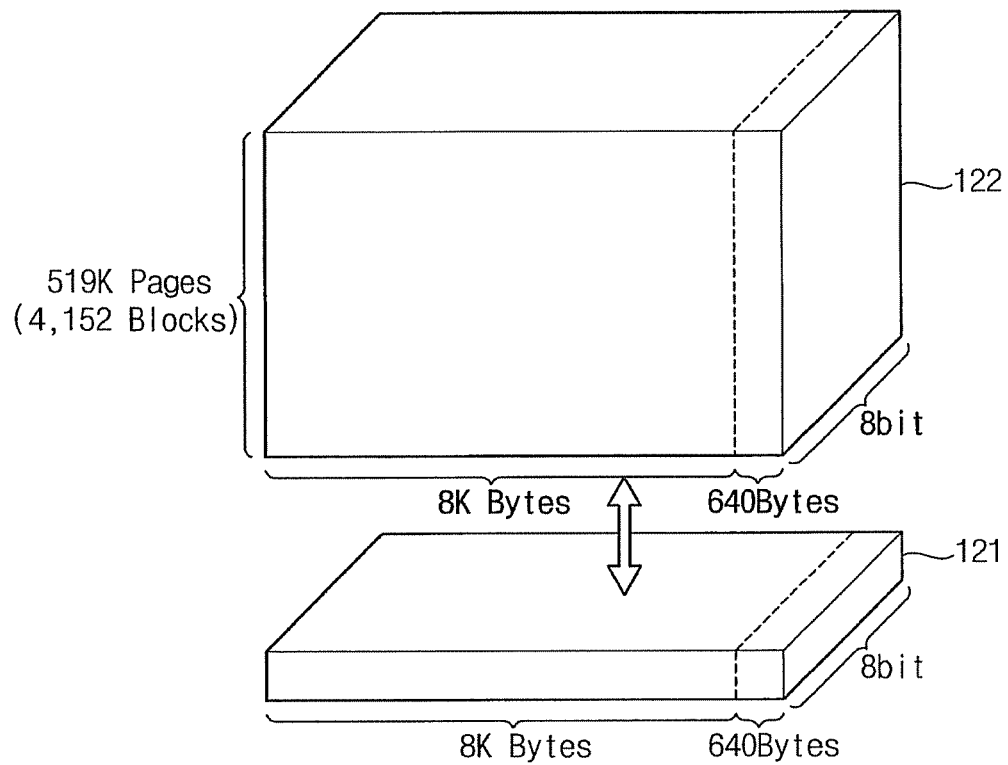
FIG. 4 is a diagram illustrating an example of storage capacity of a NAND flash memory of FIG. 3.

FIG. 4 is a diagram illustrating an example of storage capacity of a NAND flash memory of FIG. 3.

Referring to FIG. 4, in an example of a NAND flash memory device, memory cells 122 may have about 4,152 blocks, each of which has about 128 pages. Thus, the memory cells 122 may have 519k pages, each of which has a size of (8k+640) bytes. In other words, the memory cells 122 may have a size of 35,811 Mbits. A cache register 121 may have a size of one page, or (8k+640) bytes.

In some embodiments, the NAND flash memory device may include one cache register having a size of one page. In other embodiments, the NAND flash memory device may include a plurality of cache registers, each of which has a size of one page. In still other embodiments, the NAND flash memory device may include one or more cache registers, each of which has a size of two pages or more.

Figure 5:
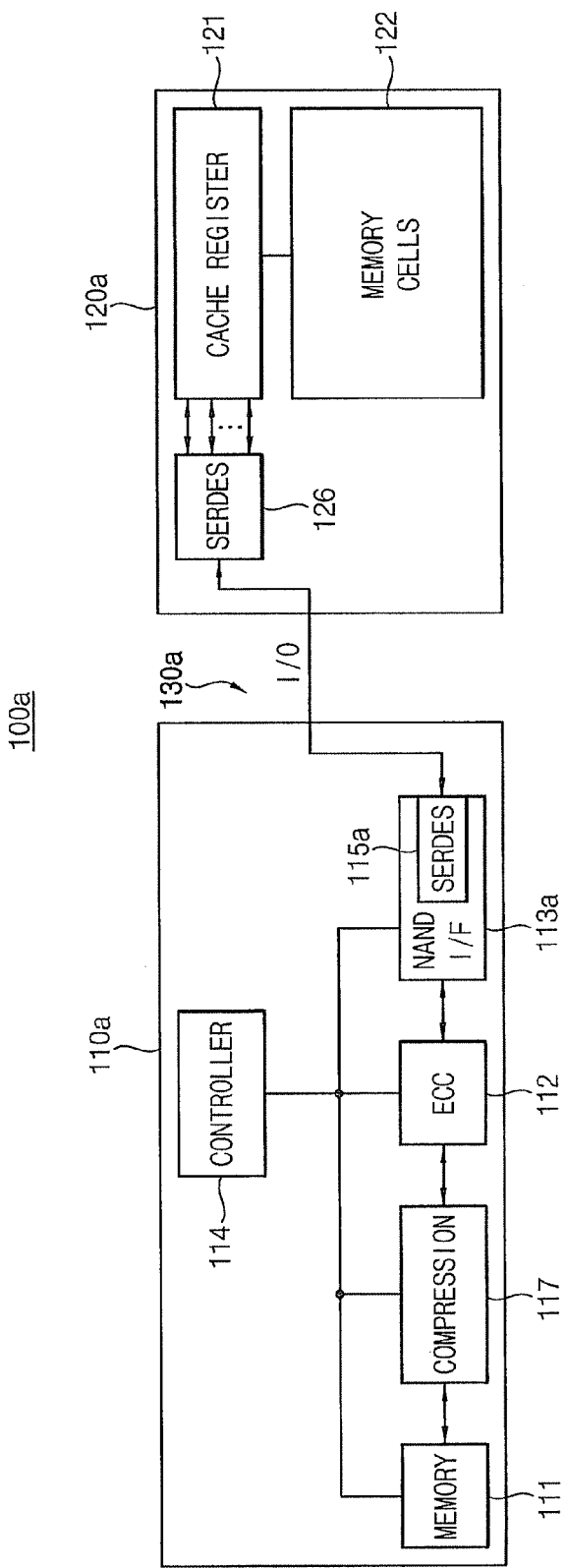
FIG. 5 is a block diagram illustrating a memory system according to at least one example embodiment.

FIG. 5 is a block diagram illustrating a memory system according to at least one example embodiments.

Referring to FIG. 5, a memory system 100a includes a control unit 110a, a NAND flash memory 120a and a channel 130a. The memory system 100a of FIG. 5 may be similar to a memory system 100 of FIG. 1 except for the channel 130a and circuits coupled to the channel 130a.

The channel 130a between the control unit 110a and the NAND flash memory 120a may include one input/output line I/O. The control unit 110a may transmit a serial signal to the NAND flash memory 120a by serializing a command, an address and/or input data using a first serializer-deserializer (SERDES) device 115a included in a NAND interface unit 113a, and the NAND flash memory 120a may deserialize the serial signal using a second SERDES device 126. Further, the NAND flash memory 120a may transmit a serial signal to the control unit 110a by serializing output data provided from the cache register 121 using the second SERDES device 126, and the control unit 110a may deserialize the serial signal using the first SERDES device 115a. Accordingly, the number of signal lines of the channel 130a between the control unit 110a and the NAND flash memory 120a may be reduced.

Figure 6:
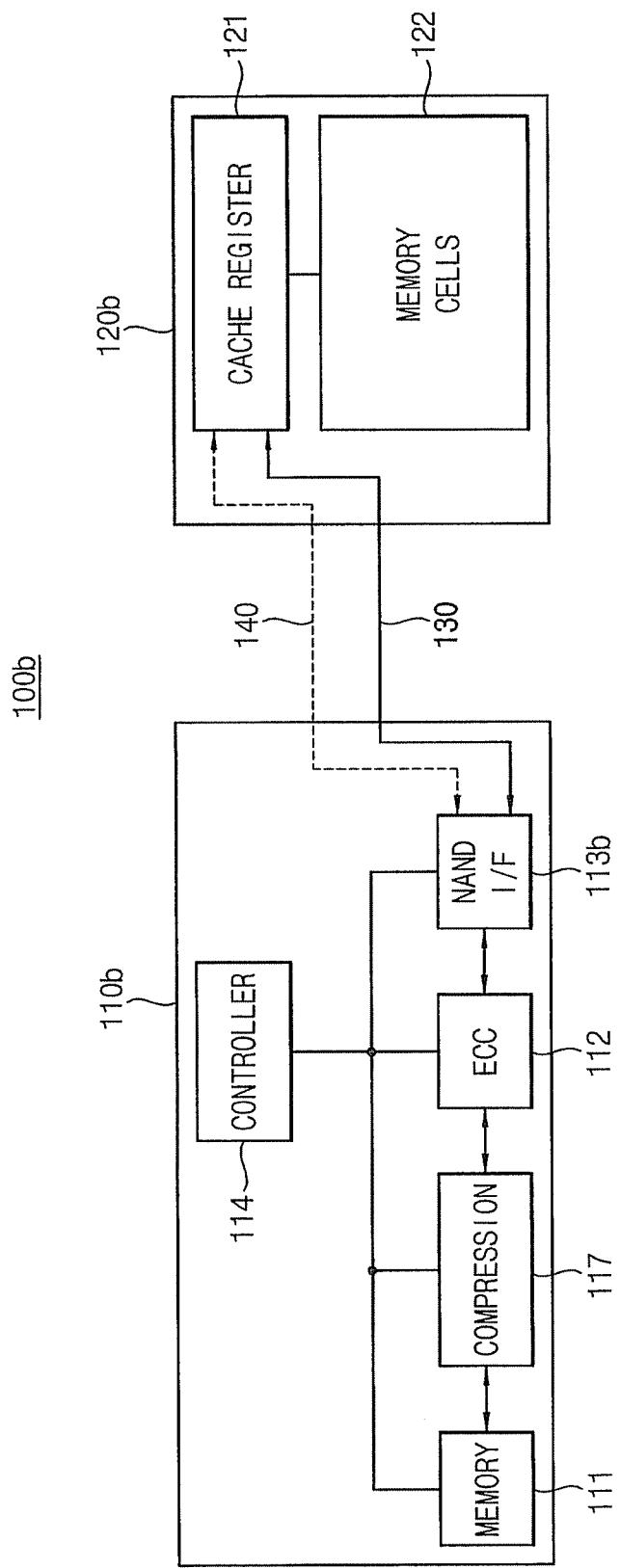
FIG. 6 is a block diagram illustrating a memory system according to at least one example embodiment.

FIG. 6 is a block diagram illustrating a memory system according to at least one example embodiment.

Referring to FIG. 6, a memory system 100b includes a control unit 110b, a NAND flash memory 120b, a first channel 130 and a second channel 140. The memory system 100b of FIG. 6 may be similar to a memory system 100 of FIG. 1 except that the memory system 100b further includes the second channel 140.

The second channel 140 may be exclusively used to transfer meta data between the control unit 110b and the NAND flash memory 120b. For example, when the memory system 100b enters a standby mode, the meta data stored in a working memory 111 may be transferred to a cache register 121 through the second channel 140. When the memory system 100b is woken up from the standby mode, the meta data stored in the cache register 121 may be transferred to the working memory 111 through the second channel 140.

In some embodiments, the second channel 140 may include one input/output line. In this case, when entering the standby mode, the meta data stored in the working memory 111 may be serialized by a first SERDES device included in a NAND interface unit 113b, and the serialized meta data may be deserialized by a second SERDES device included in the NAND flash memory 120b. When waking up from the standby mode, the meta data stored in the cache register 121 may be serialized by the second SERDES device, and the serialized meta data may be deserialized by the first SERDES device. In other embodiments, the second channel 140 may include a plurality of input/output lines.

As described above, since the memory system 100b according to at least one example embodiment may include the channel 140 exclusively used for the meta data, the transfer of the meta data may be rapidly performed. Further, a mode switch between the normal mode and the standby mode may be rapidly performed.

Figure 7:
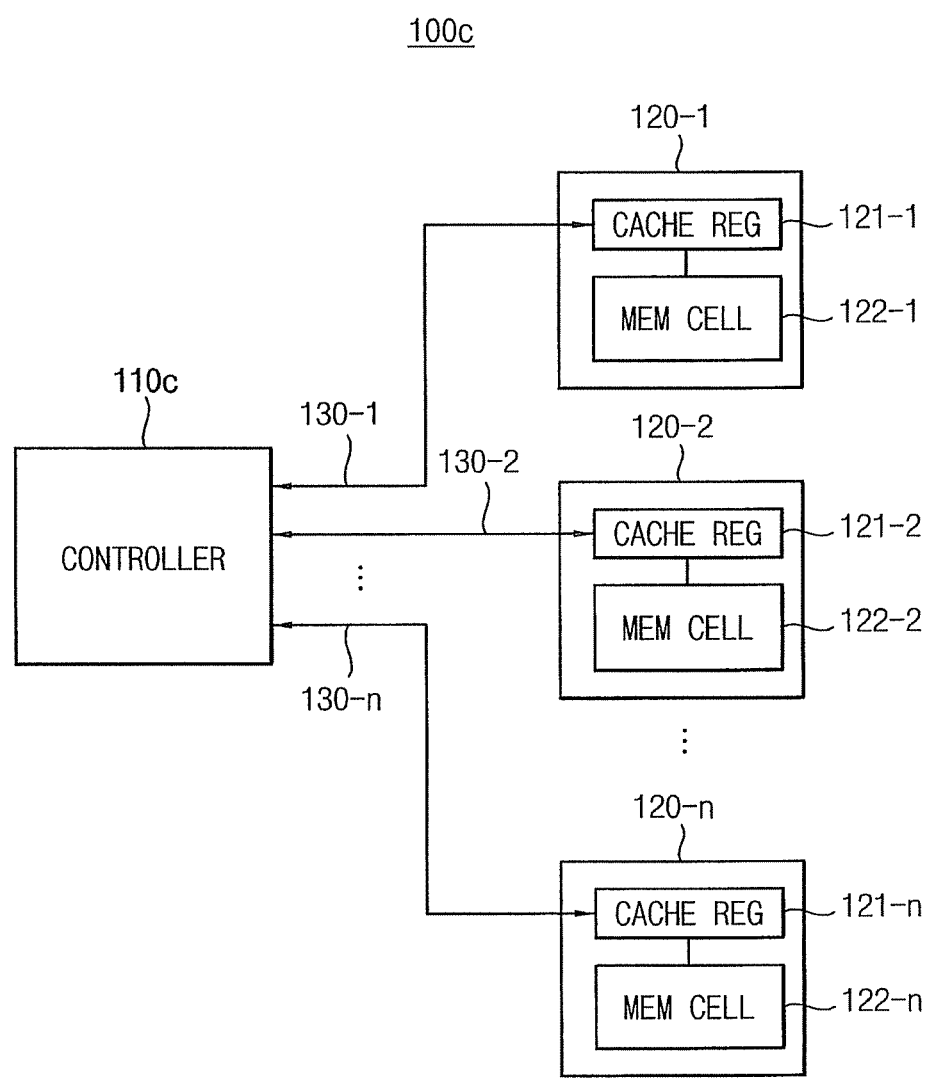
FIG. 7 is a block diagram illustrating a memory system according to at least one example embodiment.

FIG. 7 is a block diagram illustrating a memory system according to at least one example embodiment.

Referring to FIG. 7, a memory system 100c includes a control unit 110c, a plurality of NAND flash memories 120-1, 120-2 and 120-n and a plurality of channels 130-1, 130-2 and 130-n. Compared to a memory system 100 of FIG. 1, the memory system 100c of FIG. 7 may further include one or more NAND flash memories and one or more channels.

A plurality of cache registers 121-1, 121-2 and 121-n included in the plurality of NAND flash memories 120-1, 120-2 and 120-n may be independently controlled via the plurality of channels 130-1, 130-2 and 130-n, or may be simultaneously controlled. Meta data may be transferred and stored from the control unit 110c into the cache registers 121-1, 121-2 and 121-n in various manners according to the capacity and the number of working memories included in the control unit 110c, the capacity and the number of the cache registers 121-1, 121-2 and 121-n, whether a compression unit included in the control unit 110c compresses the meta data, the compression rate of the compression unit, etc.

For example, in a case where the control unit 110c includes first through fourth working memories, each of which has a capacity of 64K bytes, the compression rate of the compression unit is 1/2, the memory system 100c includes first through eighth NAND flash memories, and each of first through eighth cache registers respectively included in the first through eighth NAND flash memories has a size of 16K bytes, meta data stored in the first working memory may be stored in the first and second cache registers, meta data stored in the second working memory may be stored in the third and fourth cache registers, meta data stored in the third working memory may be stored in the fifth and sixth cache registers, and meta data stored in the fourth working memory may be stored in the seventh and eighth cache registers. In this case, in a standby mode, all of the first through fourth working memories included in the control unit 110c may not be supplied with power.

In another case where the control unit 110c includes first through fourth working memories, each of which has a capacity of 64K bytes, the compression rate of the compression unit is 1/2, the memory system 100c includes first through fourth NAND flash memories, and each of first through fourth cache registers respectively included in the first through fourth NAND flash memories has a size of 16K bytes, meta data stored in the first working memory may be stored in the first and second cache registers, and meta data stored in the second working memory may be stored in the third and fourth cache registers. In this case, in a standby mode, the first and second working memories may not be supplied with power, and the third and fourth working memories may be continuously supplied with power.

As described above, the more the memory system 100c includes the NAND flash memories 120-1, 120-2 and 120-n, the more working memories included in the control unit 110c may not be supplied with power during the standby mode. Accordingly, power consumption may be further reduced.

Although FIG. 7 illustrates an example of the memory system 110c including the plurality of channels 130-1, 130-2 and 130-n between the control unit 110c and the plurality of NAND flash memories 120-1, 120-2 and 120-n, in some embodiments, the memory system 110c may include one channel between the control unit 110c and the plurality of NAND flash memories 120-1, 120-2 and 120-n.

FIGS. 8A through 8D are block diagrams illustrating examples of various types of bus protocol of a memory system according to at least one example embodiment.

Figure 8A:
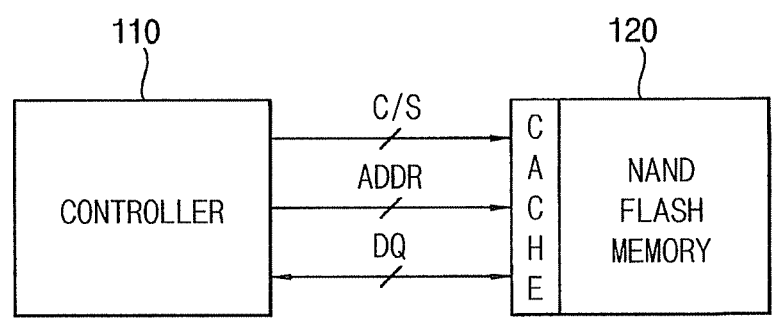
FIGS. 8A through 8D are block diagrams illustrating examples of a bus protocol of a memory system according to at least one example embodiment.

FIG. 8A illustrates a bus protocol between a NAND interface control unit 110 and a NAND flash memory 120. The NAND interface control unit 110 may transmit a control signal C/S and an address signal ADDR to the NAND flash memory 120 through a control signal line and an address signal lines, respectively. For example, the control signal C/S may include a CLE signal, an ALE signal, a /CE signal, a /RE signal, a /WE signal, a /WP signal, a R/B signal, etc. Data DQ may be transferred in both directions from the NAND interface control unit 110 to the NAND flash memory 120 and from the NAND flash memory 120 to the NAND interface control unit 110.

Figure 8B:
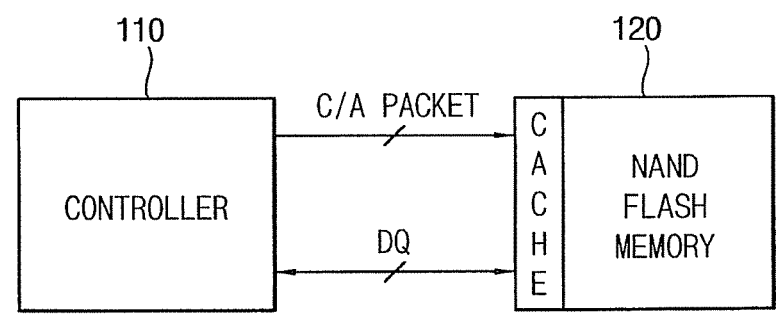

Referring to FIG. 8B, a NAND interface control unit 110 may transmit packetized control signals and address signals C/A PACKET to a NAND flash memory 120. Data DQ may be transferred in both directions.

Figure 8C:
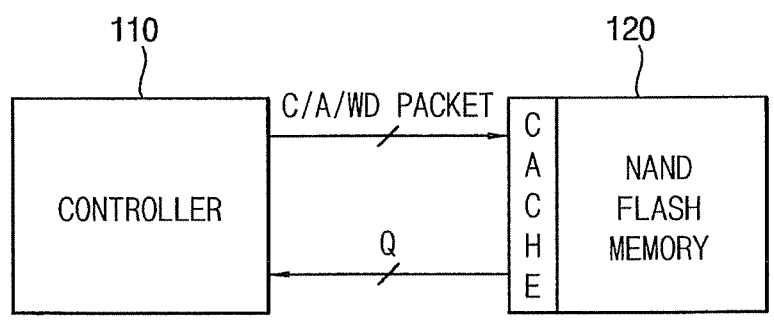

Referring to FIG. 8C, a NAND interface control unit 110 may transmit packetized control signals, address signals and write signals C/A/WD PACKET to a NAND flash memory 120. Output data Q may be transferred in one direction from the NAND flash memory 120 to the NAND interface control unit 110.

Figure 8D:
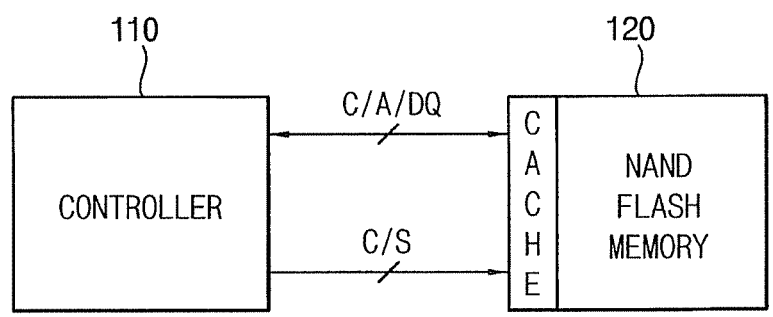

Referring to FIG. 8D, a NAND interface control unit 110 may transmit control signals C/S to a NAND flash memory 120. Command, address and data C/A/DQ may be transferred in both directions.

Figure 9:
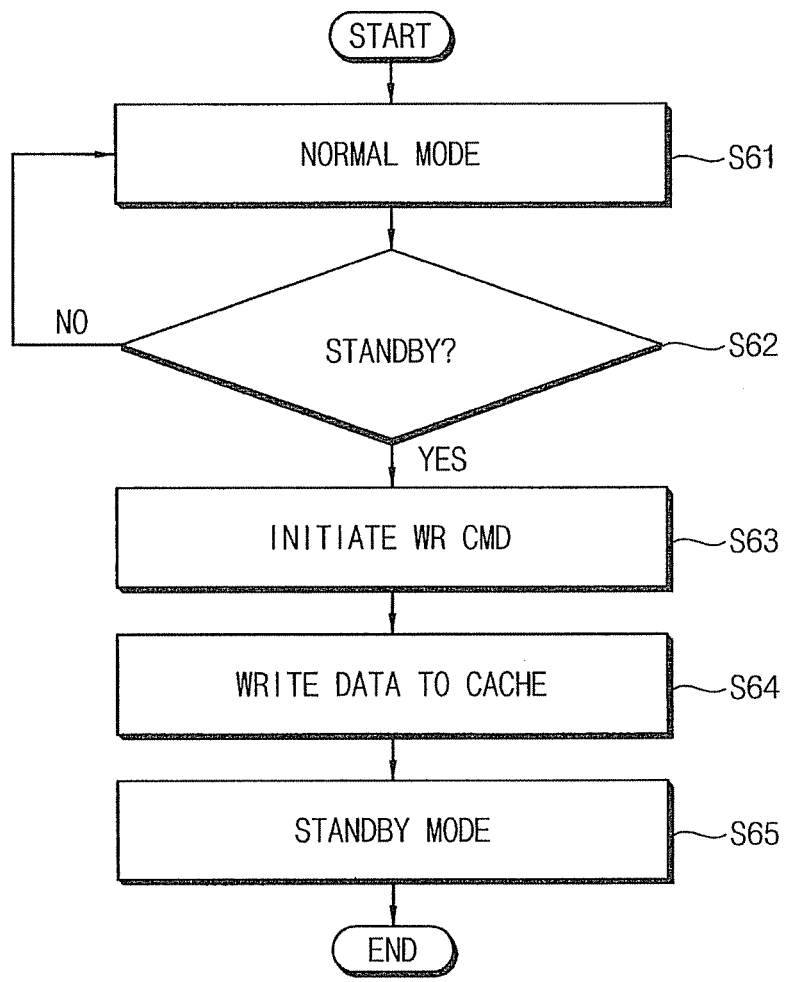
FIG. 9 is a flow chart illustrating a method of operating a memory system when the memory system transitions from a normal mode to a standby mode.

FIG. 9 is a flow chart illustrating a method of operating a memory system when the memory system transitions from a normal mode to a standby mode.

Referring to FIGS. 1 and 9, if it is not determined that the memory system 100 enters a standby mode (S62: NO), the memory system 100 may continuously operate in a normal mode (S61).

The memory system 100 may determine whether to enter the standby mode in response to an internal or external signal (S62). In some embodiments, the memory system 100 may measure a period of time, during which an external input signal is not applied, using a counter or a timer included in a control unit 110 or a NAND flash memory 120. If the measured period of time exceeds a predetermined period of time, the memory system 100 may decide to enter the standby mode. In other embodiments, the memory system 100 may determine whether to enter the standby mode according to environment information, such as remaining power of a battery. In still other embodiments, the memory system 100 may receive a standby mode entry signal from an external host to decide to enter the standby mode. In still other embodiments, the memory system 100 may receive a signal generated by an input device (e.g., when a user presses a button of a mobile phone) to decide to enter the standby mode.

If it is determined that the memory system 100 enters the standby mode (S62: YES), the control unit 110 may read meta data from a working memory 111, and may generate a write command code including the meta data (S63). For example, the write command code may have a format illustrated in FIGS. 2A through 2C, or may include only the meta data.

The control unit 110 may transmit the write command code to the NAND flash memory 120 to write the meta data to the cache register 121 (S64). For example, the write command code may be transferred to the NAND flash memory 120 through a plurality of input/output lines I/O 0, I/O 1 and I/O 7 included in a channel 130, through a serial input/output line I/O included in a channel 130a as illustrated in FIG. 5, or through a channel 140 exclusively used for the meta data as illustrated in FIG. 6. In other example, the write command code may be transferred to a plurality of NAND flash memories 120-1, 120-2 and 120-n through a plurality of channels 130-1, 130-2 and 130-n as illustrated in FIG. 7.

Once the meta data is stored in the cache register 121, memory system 100 may operate in the standby mode (S65). During the standby mode, the control unit 110 may shut off power to the working memory 111, thereby reducing power consumption. In some embodiments, the memory system may shut off power to at least a portion of circuitry except the cache register 121 of the NAND flash memory 120, thereby further reducing the power consumption.

Figure 10:
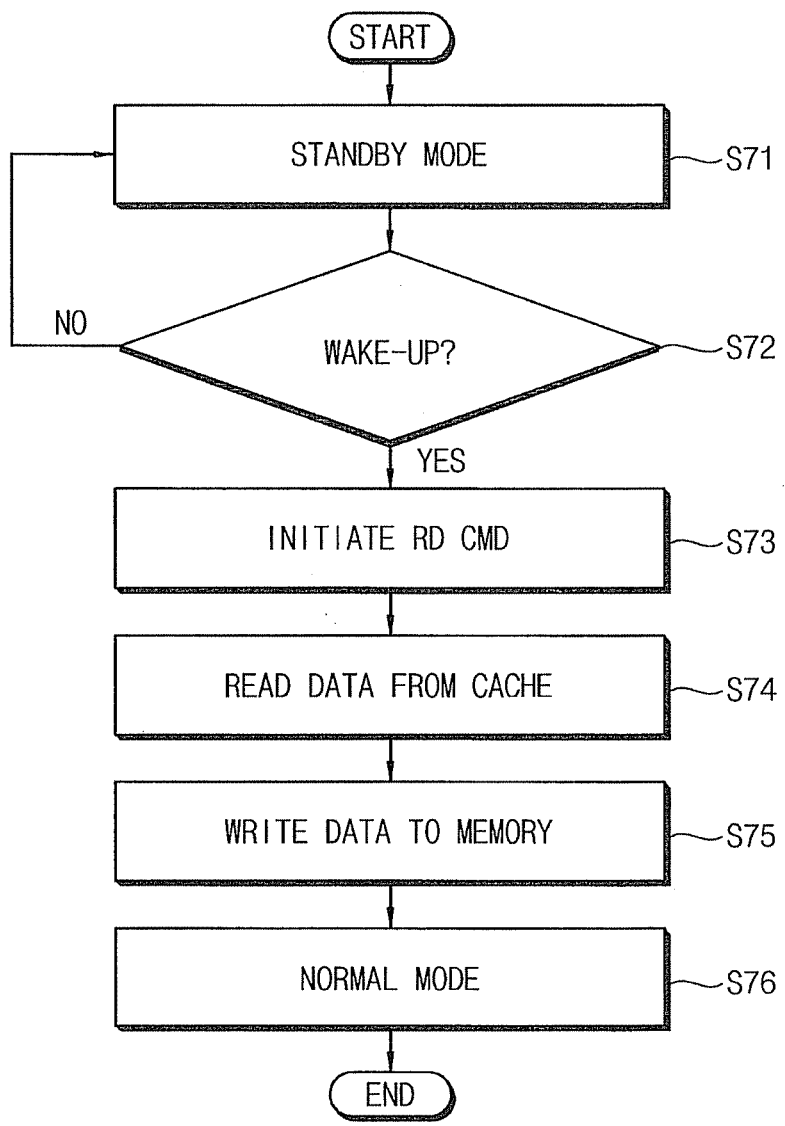
FIG. 10 is a flow chart illustrating a method of operating a memory system when the memory system transitions from a standby mode to a normal mode.

FIG. 10 is a flow chart illustrating a method of operating a memory system when the memory system transitions from a standby mode to a normal mode.

Referring to FIGS. 1 and 10, if it is not determined that the memory system 100 enters a normal mode (S72: NO), the memory system 100 may continuously operate in a standby mode (S71).

The memory system 100 may determine whether to enter the normal mode in response to an internal or external signal (S72). In some embodiments, the memory system 100 may receive a signal generated by an input device (e.g., when a user presses a button of a mobile phone) to decide to enter the normal mode. In other embodiments, when a mobile phone including the memory system 100 receives a request of a call based on a pilot signal, the memory system 100 may decide to enter the normal mode. In still other embodiments, the memory system 100 may receive a wake-up signal from an external host to decide to enter the normal mode. In still other embodiments, when a control unit 110 receives data from the host, the memory system 100 may decide to enter the normal mode.

If it is determined that the memory system 100 enters the normal mode (S72: YES), the control unit 110 may generate a read command code (S73). For example, the read command code may have a format illustrated in FIGS. 2A through 2C.

The NAND flash memory 120 may transfer meta data stored in a cache register 121 to the control unit 110 in response to the read command code (S74). For example, the meta data may be transferred to the control unit 110 through a plurality of input/output lines I/O 0, I/O 1 and I/O 7 included in a channel 130, through a serial input/output line I/O included in a channel 130a as illustrated in FIG. 5, or through a channel 140 exclusively used for the meta data as illustrated in FIG. 6.

The control unit 110 may write the meta data read from the cache register 121 to a working memory 111 (S75).

Once the meta data are stored in the working memory 111, the memory system 100 may operate in the normal mode (S76). Since the meta data are read from the cache register 121 instead of memory cells 122, the memory system 100 may rapidly perform a mode switch from the standby mode to the normal mode. In some embodiments, the meta data may include a booting code or a wake-up code, and the control unit 110 may perform a wake-up operation using the booting code or the wake-up code.

Figure 11:
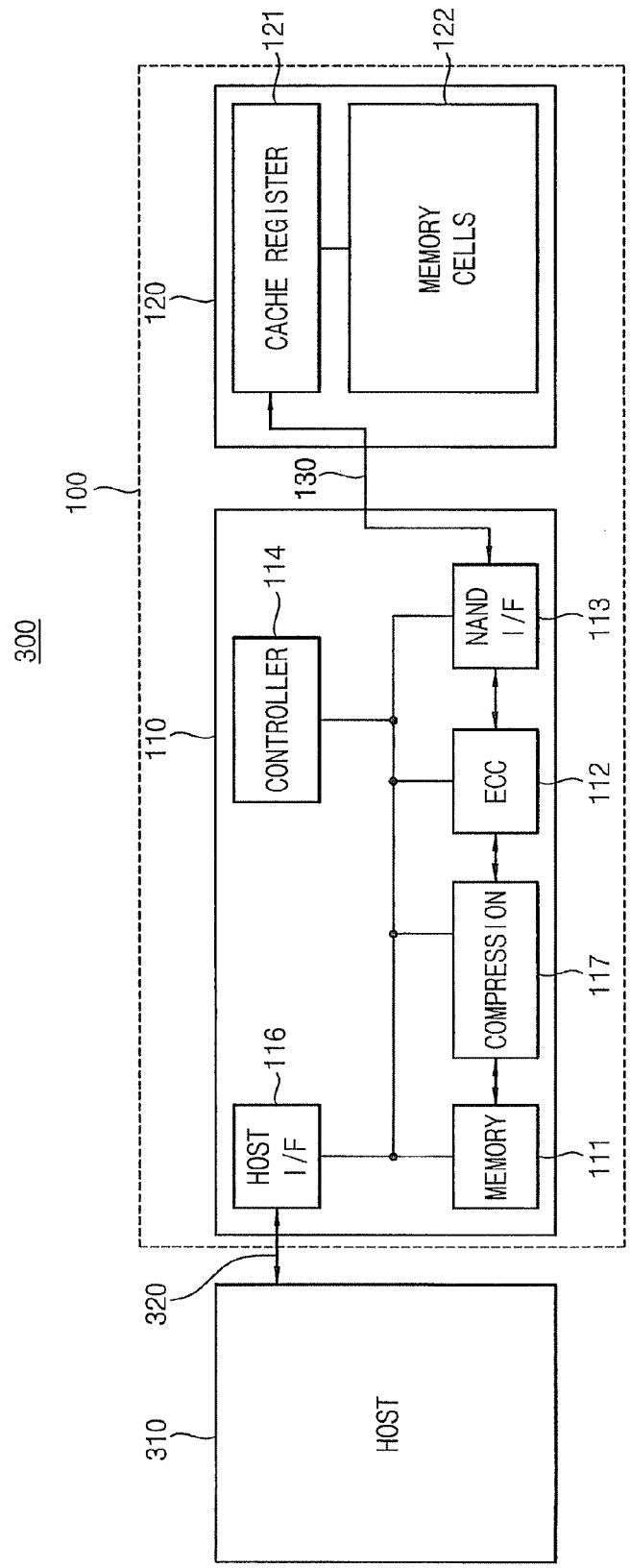
FIG. 11 is a block diagram illustrating a computing system including a memory system according to at least one example embodiment.

FIG. 11 is a block diagram illustrating a computing system including a memory system according to at least one example embodiment.

Referring to FIG. 11, a computing system 300 includes a memory system 100 and a host 310.

The memory system 100 may include a host interface unit 116 to interface with the host 310. The host interface unit 116 may use a data transfer protocol corresponding to the host 310 to communicate with the host 310 through a channel 320. For example, the host interface unit 116 may provide at least one of various interface protocols, such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI), integrated drive electronics (IDE), etc.

The memory system 100 may be implemented as a memory card, a solid state drive (SSD), etc. For example, the memory system 100 may be a memory card, such as a MMC card, a secure digital (SD) card, a micro SD card, a memory stick, an ID card, a personal computer memory card international association (PCMCIA) card, a chip card, a USB card, a smart card, a compact flash (CF) card, etc.

In some embodiments, the memory system 100 may be coupled to the host 310, such as a mobile phone, a smart phone, a personal digital assistant (PDA), a portable multimedia player (PMP), a digital camera, a portable game console, a music player, a personal computer (PC), a laptop computer, a camcorder, a video player, a digital television, etc.

In some embodiments, the memory system 100 and/or components of the memory system 100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 12:
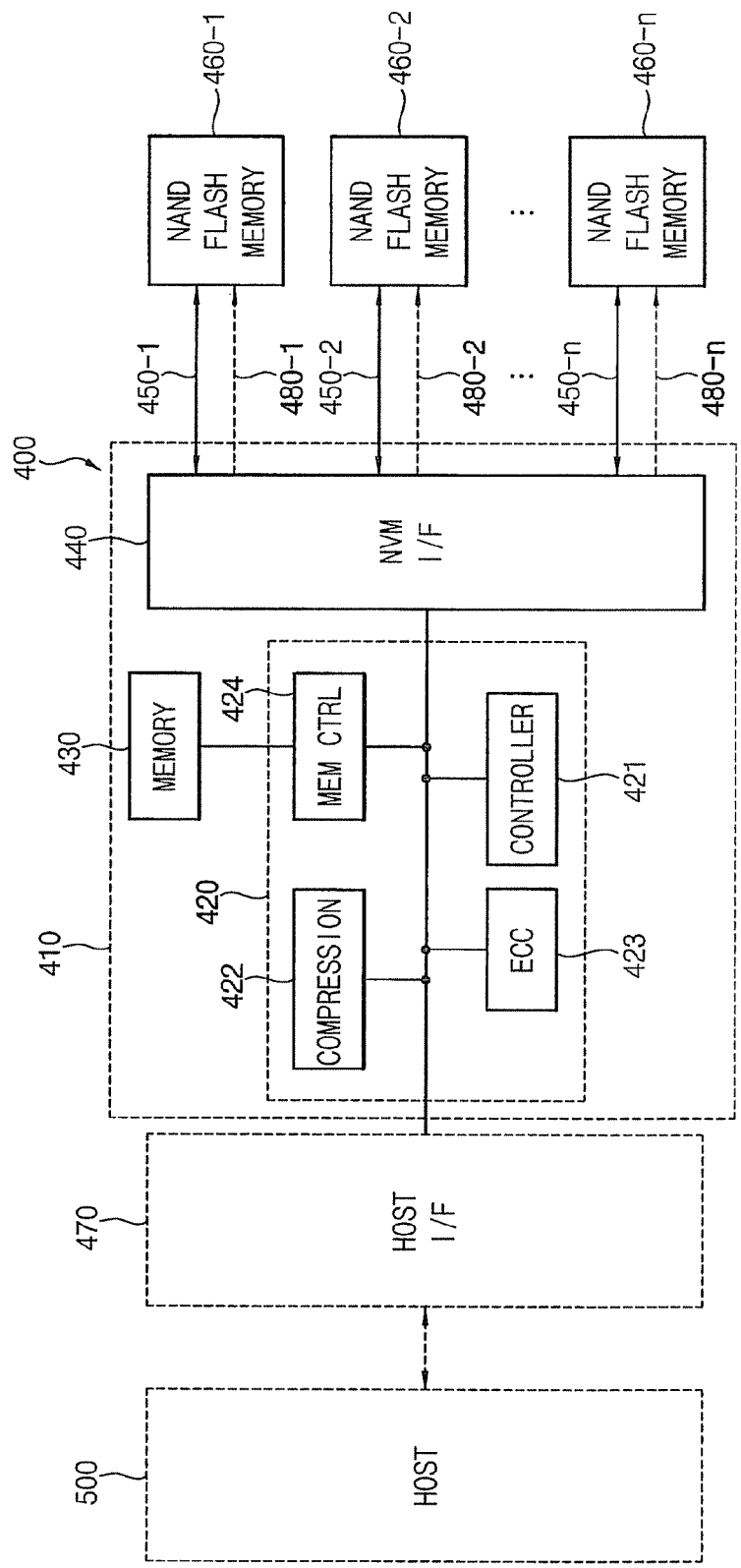
FIG. 12 is a block diagram illustrating a solid state drive (SSD) including a memory system according to at least one example embodiment.

FIG. 12 is a block diagram illustrating a solid state drive (SSD) including a memory system according to at least one example embodiment.

Referring to FIG. 12, a solid state drive 400 includes a control unit 410, a plurality of NAND flash memories 460-1, 460-2 and 460-*n* and a plurality of channels 450-1, 450-2 and 450-*n*. The control unit 410 may include a controller 421, a compression unit 422, an ECC unit 423, a memory controller 424, a working memory 430 and a NAND interface unit 440.

When the solid state drive 400 enters a standby mode, the control unit 410 may write meta data stored in the working memory 430 to the plurality of NAND flash memories 460-1, 460-2 and 460-*n* through the plurality of channels 450-1, 450-2 and 450-*n*. When the solid state drive 400 is woken up from the standby mode, the control unit 410 may receive the meta data stored in a plurality of cache registers included in the plurality of NAND flash memories 460-1, 460-2 and 460-*n* through the plurality of channels 450-1, 450-2 and 450-*n*, and may store the received meta data in the working memory 430. Accordingly, the solid state drive 400 may reduce power consumption, and may rapidly perform a mode switch.

In some embodiments, the control unit 410 may control power supply for the plurality of NAND flash memories 460-1, 460-2 and 460-*n* through a plurality of power control lines 480-1, 480-2 and 480-*n*. For example, the control unit 410 (e.g., a SSD controller) may control, through the plurality of power control lines 480-1, 480-2 and 480-*n*, the plurality of NAND flash memories 460-1, 460-2 and 460-*n* to shut off power to circuits except for the cache registers in the standby mode.

In some embodiments, the solid state drive 400 may further include a host interface unit 470 to interface with a host 500, and may be attached to the host 500, such as a mobile phone, a smart phone, a PDA, a PMP, a digital camera, a portable game console, a music player, a PC, a laptop computer, a camcorder, a video player, a digital television, etc.

Although FIG. 12 illustrates an example where the working memory 430 is implemented outside a chip in which the controller 421 is formed, in some embodiments, the working memory 430 and the controller 421 may be implemented in the same chip. Although FIG. 12 illustrates an example where the control unit 410 includes a separate memory controller 424, in some embodiments, the memory controller 424 may be integrated in the working memory 430 or the controller 421.

Figure 13:
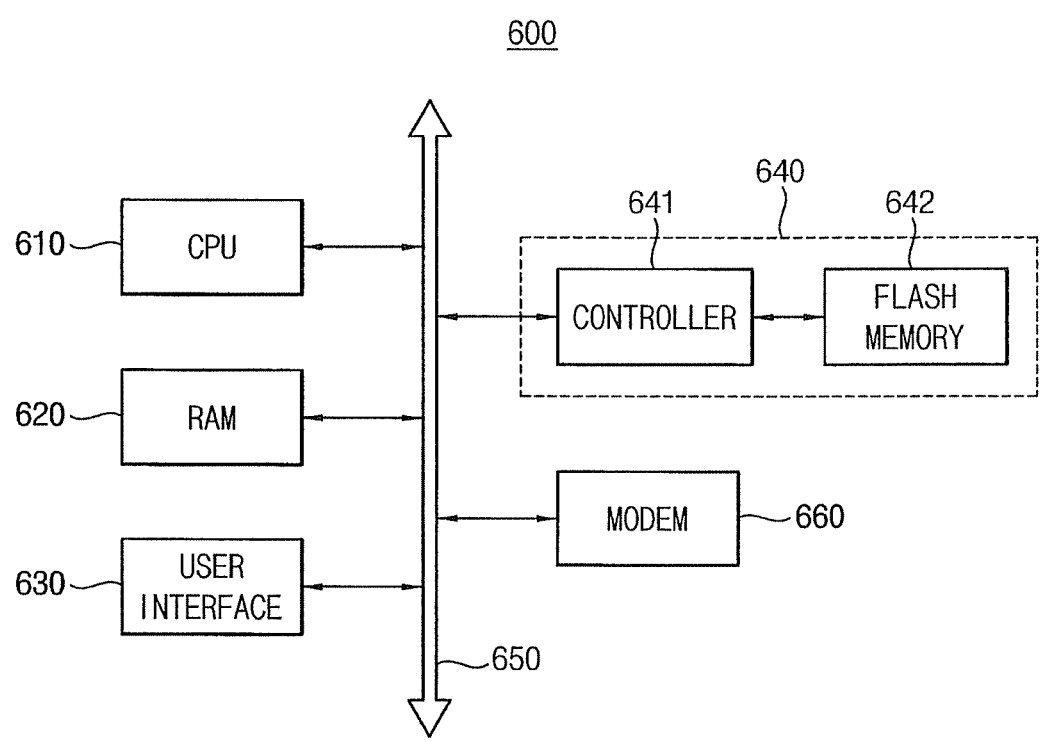
FIG. 13 is a block diagram illustrating a mobile system including a memory system according to at least one example embodiment.

FIG. 13 is a block diagram illustrating a mobile system including a memory system according to at least one example embodiment.

Referring to FIG. 13, a mobile system 600 includes a processor 610, a memory 620, a user interface 630, a modem 660 (e.g., baseband chipset) and a memory system 640.

The processor 610 may perform various computing functions, such as executing specific software for performing specific calculations or tasks. For example, the processor 610 may be a microprocessor, a central process unit (CPU), a digital signal processor, or the like. The processor 610 may be coupled to the memory 620 via a bus 650, such as an address bus, a control bus and/or a data bus. For example, the memory 620 may be implemented by a DRAM, a mobile DRAM, a SRAM, a PRAM, a FRAM, a RRAM and/or a MRAM. The processor 610 may be coupled to an extension bus, such as a peripheral component interconnect (PCI) bus. Accordingly, the processor 610 may control the user interface 630 including at least one input device, such as a keyboard, a mouse, etc., and at least one output device, such as a display device, a printer, etc. The modem 660 may wirelessly communicate with an external device. A NAND flash memory 642 may store data processed by the processor 610 or data received via the modem 660. The mobile system 600 may further include a power supply, an application chipset, a camera image processor (CIS), etc.

As described above, since meta data are stored in a cache register of the NAND flash memory 642 when the memory system 640 enters a standby mode, power consumption may be reduced in the standby mode, and a mode switch may be rapidly performed.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory system, comprising:
    a NAND flash memory including a cache register and memory cells, the NAND flash memory configured to store data in the memory cells via the cache register; and
    a control unit including a working memory, the control unit configured to control the NAND flash memory, and to store meta data in the working memory,
    wherein the control unit is configured to transfer the meta data stored in the working memory to the NAND flash memory, and to control the NAND flash memory to store the meta data in the cache register and not in the memory cells if the memory system enters a standby mode.

2. The memory system of claim 1, wherein the NAND flash memory is configured to read the meta data from the working memory and write the meta data to the cache register in response to a write command generated by the control unit when the memory system enters the standby mode.

3. The memory system of claim 2, wherein the control unit is configured to generate the write command such that an address field included in a code of the write command has a NULL state.

4. The memory system of claim 2, wherein the control unit is configured to generate the write command such that a code of the write command does not include an address field.

5. The memory system of claim 2, wherein the control unit is configured to generate the write command such that a code of the write command indicates that the meta data read from the working memory is to be written only to the cache memory, and is different from a code of a normal write command that indicates normal data are to be written to the memory cells via the cache memory.

6. The memory system of claim 1, wherein the NAND flash memory is configured to read the meta data from the cache register and to write the meta data to the working memory in response to a read command generated by the control unit when the memory system is woken up from the standby mode.

7. The memory system of claim 1, wherein
the memory cells are arranged in a matrix form of a plurality of columns and a plurality of rows, and
the cache register corresponds to one of the plurality of columns or one of the plurality of rows.

8. The memory system of claim 1, wherein the memory system is configured such that the memory cells are not supplied with power during the standby mode.

9. A memory system comprising:
a control unit including a working memory configured to store meta data, the control unit being configured to control a flash memory unit including a plurality of memory cells and a cache register such that if the memory system is in a standby mode, the control unit transfers the meta data stored in the working memory to the flash memory unit, and generates a standby write command indicating the flash memory unit to store the meta data in the cache register and not in the plurality of memory cells.

10. The memory system of claim 9, further comprising:
the flash memory unit, wherein
the cache register is configured to store data to be written to the plurality of memory cells, and
the memory system is configured such that if the memory system enters the standby mode, the memory system supplies power to the cache register, and the memory system reduces power being supplied to the working memory.

11. The memory system of claim 10, wherein the memory system is configured such that if the memory system enters the standby mode, the memory system does not supply power to the working memory.

12. The memory system of claim 11, wherein the memory system is configured such that if the memory system enters the standby mode, the memory system does not supply power to the plurality of memory cells.

13. A memory system comprising:
a flash memory unit including a plurality of memory cells and a cache register configured to store data to be written to the plurality of memory cells, the flash memory unit being configured to be controlled by a control unit including a working memory storing meta data such that, if the memory system is in a standby mode, the flash memory unit receives the meta data stored in the working memory from the control unit, and stores the meta data in the cache register and not in the plurality of memory cells in response to a write command received from the control unit.

14. The memory system of claim 13, further comprising:
the control unit, wherein
the cache register is configured to store data to be written to the plurality of memory cells, and
the memory system is configured such that if the memory system enters the standby mode, the memory system supplies power to the cache register, and the memory system reduces power being supplied to the working memory.

15. The memory system of claim 14, wherein the memory system is configured such that if the memory system enters the standby mode, the memory system does not supply power to the working memory.

16. The memory system of claim 15, wherein the memory system is configured such that if the memory system enters the standby mode, the memory system does not supply power to the plurality of memory cells.

17. The system of claim 9, wherein the control unit is configured to generate the write command to include a first code,
the first code indicating that the meta data read from the working memory is to be written to the cache memory and not written to the memory cells, and the first code being different from a code of a normal write command that indicates normal data is to be written to the memory cells via the cache memory.

18. The system of claim 13, wherein the flash memory unit is configured to detect, in the write command, a first code,
the first code indicating that the meta data is to be written to the cache memory and not written to the memory cells, the first code being different from a code of a normal write command that indicates normal data are to be written to the memory cells via the cache memory.

* * * * *